(12) United States Patent
Zinn

(10) Patent No.: US 10,616,994 B2
(45) Date of Patent: Apr. 7, 2020

(54) THERMAL MANAGEMENT IN CIRCUIT BOARD ASSEMBLIES

(71) Applicant: Kuprion, Inc., Menlo Park, CA (US)

(72) Inventor: Alfred A. Zinn, Palo Alto, CA (US)

(73) Assignee: Kuprion, Inc., San Jose, CA (US)

( * ) Notice: Subject to any disclaimer, the term of this patent is extended or adjusted under 35 U.S.C. 154(b) by 0 days.

(21) Appl. No.: 16/264,962

(22) Filed: Feb. 1, 2019

(65) Prior Publication Data

US 2019/0246491 A1  Aug. 8, 2019

Related U.S. Application Data

(60) Provisional application No. 62/625,668, filed on Feb. 2, 2018.

(51) Int. Cl.
| | |
|---|---|
| *H01K 3/10* | (2006.01) |
| *H05K 1/02* | (2006.01) |
| *H05K 3/40* | (2006.01) |
| *H05K 1/09* | (2006.01) |

(52) U.S. Cl.
CPC ............ *H05K 1/0206* (2013.01); *H05K 1/09* (2013.01); *H05K 3/4053* (2013.01); *H05K 1/097* (2013.01); *H05K 2201/0257* (2013.01); *H05K 2201/066* (2013.01)

(58) Field of Classification Search
CPC ...... H05K 1/0206; H05K 1/09; H05K 3/4053; H05K 2201/066; H05K 2201/0257; Y10T 29/49155; Y10T 29/49158; Y10T 29/49165
USPC .......................................... 29/846, 851, 852
See application file for complete search history.

(56) References Cited

U.S. PATENT DOCUMENTS

| | | | |
|---|---|---|---|
| 7,321,098 B2 * | 1/2008 | Sarma | H01L 23/15 174/252 |
| 8,900,704 B1 * | 12/2014 | Zinn | H01L 23/373 361/708 |
| 9,565,748 B2 * | 2/2017 | Glickman | H05K 1/0206 |
| 2015/0114707 A1 | 4/2015 | Glickman | |
| 2015/0189759 A1 | 7/2015 | Rovere et al. | |

\* cited by examiner

*Primary Examiner* — Donghai D Nguyen
(74) *Attorney, Agent, or Firm* — Vorys, Sater, Seymour and Pease LLP

(57) ABSTRACT

Vias may be established in printed circuit boards or similar structures and filled with a monolithic metal body to promote heat transfer. Metal nanoparticle paste compositions may provide a ready avenue for filling the vias and consolidating the metal nanoparticles under mild conditions to form each monolithic metal body. The monolithic metal body within each via can be placed in thermal contact with one or more heat sinks to promote heat transfer.

17 Claims, 4 Drawing Sheets

THERMAL MANAGEMENT IN CIRCUIT BOARD ASSEMBLIES

CROSS-REFERENCE TO RELATED APPLICATIONS

The present disclosure claims the benefit of priority under 35 U.S.C. § 119 from U.S. Provisional Patent Application 62/625,668, filed on Feb. 2, 2018 and incorporated herein by reference in its entirety.

BACKGROUND

Ineffective thermal communication between a heat source and a thermal management system like a heat sink can hamper dissipation of excess heat from a system. Electronic components, such as high-power LEDs and high-power circuitry, for example, are continually decreasing in size and becoming ever more powerful, thereby generating loads of excess heat that are increasingly being concentrated in smaller and smaller spaces. Growing production of excess heat and concentration thereof can make effective heat removal especially problematic.

Failure to remove excess heat from an electronic system can result in significant consequences such as, for example, overheating, reduced conduction, higher power requirements than normal, and/or the need for clock-down operation to avoid board burnout and device failure. In many instances, operational modifications are employed to limit the production of excess heat, rather than altering the system architecture to promote better heat removal. Thus, certain systems may be operated in an inefficient condition compared to how they would otherwise be operated if removal of the excess heat did not prove so problematic.

Ineffective heat conduction can be especially prevalent in circuit boards of various types, particularly printed circuit boards (PCBs). PCBs and similar circuit boards are thermal insulators by the very nature of their construction. Specifically, PCBs generally employ thermally insulating substrates (e.g., glass fiber epoxy composites like FR4, which has a thermal conductivity value of 0.25 W/m·K), upon which appropriate electronic circuitry and various board components are disposed. The low thermal conductivity values of PCB substrates can make removal of excess heat from electronic systems rather difficult. Very little excess heat is capable of being removed via the leads due to their typically small size. In addition, conventional lead solder is not especially thermally conductive (e.g., about $1/10^{th}$ or less than that of more thermally conductive metals, such as copper). Similarly, the metal traces (circuitry) defined in PCBs are typically thin and embedded in the substrate, thereby not allowing much heat dissipation to take place.

In some cases, heat dissipation may be improved by adding a thermal ground plane to one face of the PCB. However, this design prevents the use of that particular face of the board for adding components to increase the complexity and functionality of the PCB, thereby limiting its design and use. Another option sometimes used is incorporation of a thicker copper layer in the center of the board as a highly conductive thermal path. This approach poses manufacturing challenges to incorporate such a large and thick copper sheet, particularly due to its vastly different thermal expansion properties, thereby leading to mechanical stresses during PCB manufacture and operation. In fact, mechanical stress resulting from thermal expansion may render the PCB ineffective for the very thermal conduction purpose it was designed for. Again, the complexity of the board may be limited unless the board can be effectively connected to a thermal plane.

Current architectures for removing excess heat from PCBs or similar circuit boards only offer one way out for the excess heat, through a heat sink or similar thermal management device in thermal communication with a component generating the excess heat, such that the excess heat is conveyed away without passing through the PCB substrate. This approach allows heat dissipation to take place from only a single face of the PCB. Growing heat removal demands have often necessitated the use of increasingly large and heavy heat sinks, such as machined copper blocks, to maximize the surface area in thermal communication with the source of excess heat to promote better heat dissipation. Even so, it can still be difficult to dissipate excess heat due to the poor thermal conductivity of the PCB substrate and limited available space for mounting the heat sink. Moreover, copper and similar metal blocks are heavy, which may be undesirable for payload-sensitive operations, and they may be subject to disengagement during rough transport or other conditions of use, thereby precluding effective conveyance of excess heat. Thus, present approaches for affecting removal of excess heat from PCBs and similar circuit board assemblies are becoming increasingly less effective, thereby hampering further advances in board technology as a whole.

It is possible, in principle, to introduce features into PCBs or similar circuit board assemblies to improve heat conduction, including to the opposite face of the board relative to where the excess heat is being generated, but this approach can lead to problems in its own right using conventional metal processing techniques. For example, one or more holes (vias) may be drilled through a PCB substrate directly beneath a component producing excess heat, and the holes may be loaded with a highly conductive material, such as copper. This approach could increase the overall thermal conductivity value of the PCB. However, direct liquid casting of metals into vias is not compatible with the board materials that are presently in use (metal processing temperatures >1000° C. in comparison to much lower polymer melting points for materials typically used as substrates). As such, vias are often packed with rosin or a similar filler and then galvanically capped at the ends or left open with just a thick metal plating (e.g., copper) on the via walls (i.e., the via barrel). Coating thicknesses upon the via walls are typically in the range of ~25 microns. Although metal plating approaches may be effective to promote electronic conductivity between components in various board layers, metal plating only marginally increases the thermal conductivity profile, since the surface area of the metal exposed at the board face remains rather small.

As such, thermal vias of the foregoing type are usually limited to small diameters, oftentimes a diameter of 1 mm or less, because electroless copper plating does not allow for effective filling of large holes or high aspect ratio vias. Since it would take a very long time (days) to completely fill vias having a diameter in this size range, a large number of incompletely filled vias are often used for promoting effective heat removal. However, this approach may be insufficient for removing large quantities of heat (e.g., >100 $W/cm^2$). Moreover, an excessive amount of vias can promote mechanical weakness in a PCB.

BRIEF DESCRIPTION OF THE DRAWINGS

The following figures are included to illustrate certain aspects of the present disclosure, and should not be viewed as exclusive embodiments. The subject matter disclosed is capable of considerable modifications, alterations, combinations, and equivalents in form and function, as will occur to one having ordinary skill in the art and the benefit of this disclosure.

DETAILED DESCRIPTION

Figure 1:
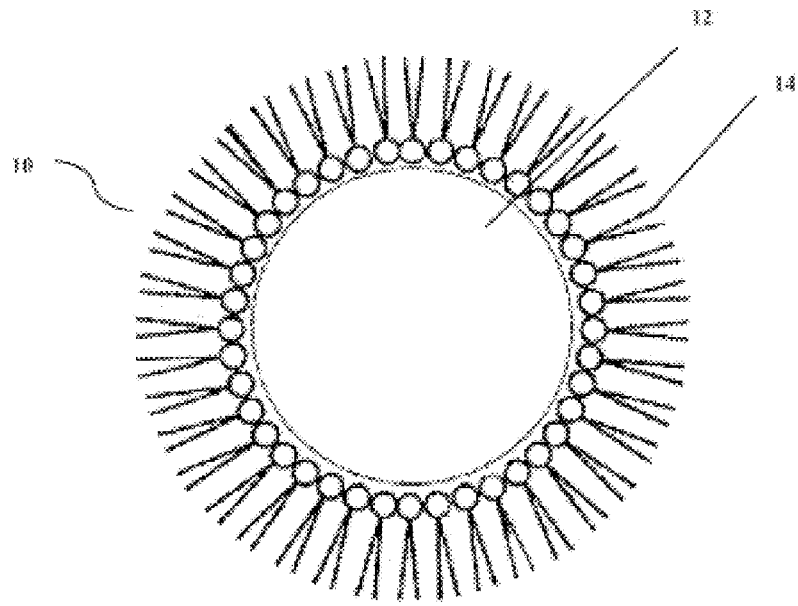
FIGS. 1 and 2 show diagrams of presumed structures of metal nanoparticles having a surfactant coating thereon.

The present disclosure is generally directed to circuit board technology and, more specifically, to techniques for thermal management in printed circuit boards (PCBs) and related electronic systems. Other systems in which dissipation of excess heat is problematic may also be addressed effectively with concepts related to those disclosed herein.

As discussed above, removal of excess heat from circuit boards and related electronics assemblies can be problematic due to the prevalence of thermally insulating materials therein. Because of this issue, effective thermal management techniques presently utilize rather large heat sinks, with heat removal taking place from only one face of the circuit board. As such, limited amounts of excess heat can be removed when using conventional thermal management techniques.

Although metals may be electrodeposited onto via walls to promote electronic conductivity between components in various board layers, the thin metal layers do little to increase thermal conductivity for promoting dissipation of excess heat. It is very problematic indeed to extend metal plating approaches to afford more complete filling of vias to improve thermal conductivity. Via filling with electrodeposited metal (e.g., copper) usually takes many hours to complete and must be performed carefully to avoid premature capping of the hole and formation of an excessive void space in the via, thereby leading to even poorer thermal conduction. Electrodeposition approaches are therefore very expensive and are often a money-losing operation for manufacturers. Moreover, vias that can be successfully filled via electrodeposition typically have very narrow cross-sectional profiles (diameters) of about 100 microns to about 300 microns in order to limit the time needed to complete the electrodeposition process and obtain a fill factor approaching 100%. The small cross-sectional profiles of electrodeposition-filled vias again limits the amount of thermal conduction that may take place. In addition, for the most effective thermal management benefits to be realized, the vias are typically located directly beneath a board component producing the excess heat. It can be difficult in its own right to introduce and fill vias in this location, particularly if the board component has already been placed on the PCB.

The present disclosure provides an entirely different approach for filling vias and similar conduits to establish one or more thermal conduction pathways extending completely through the insulating substrate of a PCB or similar circuit board assembly. Advantageously, the via-filling approaches described herein may be performed rapidly and at much lower cost than electrodeposition approaches, while still readily affording high-quality, large thermally conductive monolithic metal bodies that extend completely through a PCB substrate. The thermally conductive areas may be in the form of trenches, ducts, and/or vias. Thus, although the present disclosure is largely directed to the filling of vias, it is to be appreciated that alternative structures may be processed analogously. Because the various approaches of the present disclosure allow relatively large vias or similar conduits to be filled with metal, a greater degree of thermal conduction may be realized compared to that obtainable conventionally using electrodeposition techniques.

Advantageously, the present disclosure provides a PCB architecture from which excess heat can be dissipated from a face of the board opposite that where a component producing excess heat is located. Namely, metal-filled vias produced according to the disclosure herein may allow excess heat to be conveyed from a first face of the board to a second face of the board (i.e., across the insulating substrate of the board), where the excess heat may be more effectively dissipated in some cases. For example, it may be easier to locate a thermal management device on a face of the PCB opposite a component producing the excess heat. Moreover, the present disclosure also allows heat dissipation to take place from both (opposing) faces of the board, if desired, thereby allowing the same or different thermal management approaches to be utilized upon each face. Furthermore, in some embodiments, the present disclosure allows for a thermal connection to be established between a face of the board and a metal casing housing the board, thereby allowing the metal casing to function advantageously as a very large heat sink without utilizing a dedicated metal block to promote thermal conduction. In some cases, a direct metallurgical bond may be established between a metal-filled via and a thermal management device in contact therewith.

More specifically, the present disclosure utilizes metal nanoparticle compositions to affect filling of vias or similar structures for establishing one or more thermally conductive pathways extending through the insulating substrate of a PCB or similar circuit board assembly. The thermally conductive pathway formed from the metal nanoparticles may comprise a monolithic block of metal or metal composite (equivalently referred to herein as a "monolithic metal block" or "monolithic metal body") extending between the first and second faces of the PCB. The monolithic metal block may span the entire cross-sectional profile of the via, thereby providing a much larger exposed surface area for promoting thermal conduction than is possible with electrodeposition approaches. As discussed above, electrodeposition approaches are difficult to perform and are at considerable risk of incomplete via filling and/or void formation, thereby leading to poor thermal conduction. Such issues are much less prevalent when utilizing metal nanoparticles, thereby allowing vias having a much larger cross-sectional profile to be filled with metal.

Previous approaches for filling vias with metal nanoparticles are described in U.S. Patent Application Publication 2015/0114707. However, there may be difficulties associated with effective filling, cracking, delamination, and failure, particularly for vias above a particular size.

Metal nanoparticles are uniquely qualified for the applications described herein due to the moderate processing conditions needed for consolidating the metal nanoparticles together into a monolithic block of the corresponding bulk metal. Namely, as described in further detail below, metal nanoparticles can be consolidated (fused) together into the corresponding bulk metal under a range of mild processing conditions that are significantly below the melting point of the metal itself. Due to copper's high thermal conductivity and relatively low cost, copper nanoparticles can be a particularly desirable type of metal nanoparticle for use in the various embodiments of the present disclosure.

In addition, if desired or needed, metal nanoparticle compositions may be further tailored to improve the thermal conductivity still further when filling vias or similar structures. In particular, the metal nanoparticle compositions may be tailored to limit shrinkage during fusion, which may exceed 20% in other metal nanoparticle systems, and limit thermal expansion to reduce thermomechanical stress during operational hot-cold cycling. More specifically, metal nanoparticle compositions suitable for use in the present disclosure may contain larger micron-sized, highly thermally conductive particles (e.g., copper, diamond, carbon nanotubes, graphene, and the like) while still being easily dispensed by various via-filling techniques. These features greatly simplify PCB assembly and provide overall product cost reduction while significantly enhancing performance. Once nanoparticle consolidation occurs, the resulting bulk metal binds the micron-scale additives together to form a monolithic metal body extending through the insulating substrate of the PCB, thereby providing a thermally conductive pathway through the substrate. Additional tailoring to promote dispensation and/or consolidation of the metal nanoparticles may also be performed, as described hereinafter.

Although advantageous for promoting thermal conduction, the concepts of the present disclosure can also be employed for general filling of vias as well, more specifically buried vias and thermal traces within the board architecture, thereby allowing single-step co-processing to be realized during various board lamination steps to allow ready incorporation into the overall PCB manufacturing process. Through-plane vias having electronic functionality in addition to thermal conduction may be filled with a monolithic metal body according to the present disclosure as well. These operations may be facilitated since the processing conditions used for consolidating metal nanoparticles are fully compatible with the temperature and pressure conditions typically employed for laminating multi-layer PCBs. This approach further allows the ready connection of different electrical and thermal planes within the board for facilitating heat dissipation throughout a PCB. Direct metallurgical bonding of the monolithic metal body to promote an electrical connection may be realized by placing the metal nanoparticle composition in contact with an electrical interconnect prior to fusing the metal nanoparticles together with one another.

PCB manufacturing occurs under harsh conditions, oftentimes requiring high pressures and temperatures. Each layer may be processed separately, thereby causing distortions, misalignments and thermal stresses. The more process integration is made possible, the higher the reliability and robustness of the final product. The disclosure herein provides for this high level of process integration in an unparalleled way, with the conformal nature of the metal nanoparticle composition allowing it to be integrated into production and directly applied to form buried vias, traces and trenches that may accommodate distortions and misalignments without breaking a connection.

As used herein, the term "metal nanoparticle" refers to metal particles that are about 100 nm or less in size, without particular reference to the shape of the metal particles.

As used herein, the term "micron-scale metal particles" refers to metal particles that are about 100 nm or greater in size in at least one dimension.

The terms "consolidate," "consolidation" and other variants thereof are used interchangeably herein with the terms "fuse," "fusion" and other variants thereof.

Figure 6:
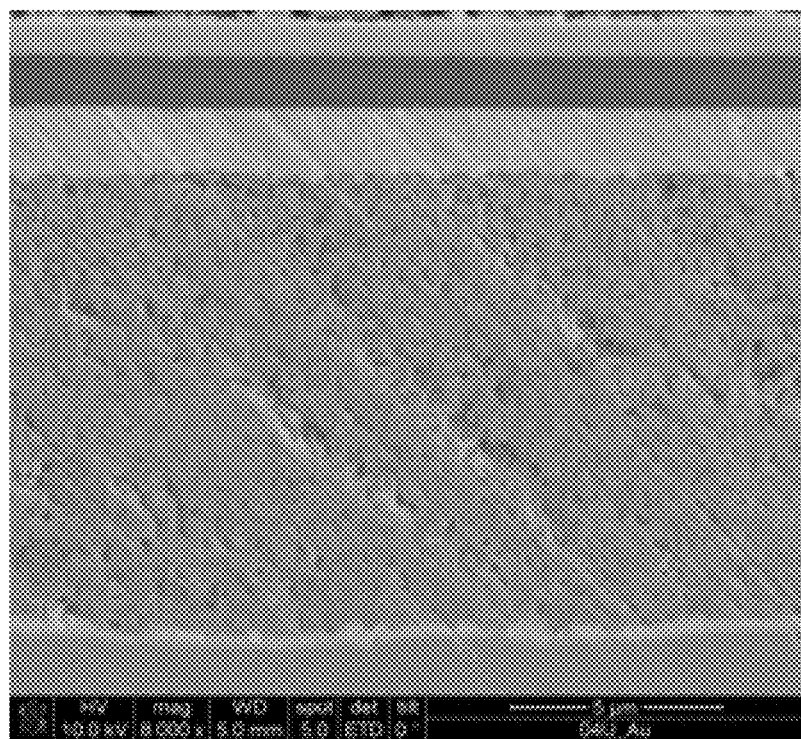
FIG. 6 shows an SEM image that illustrates porosity in a consolidated copper nanoparticle paste composition.

As used herein, the terms "partially fused," "partial fusion," and other derivatives and grammatical equivalents thereof refer to the partial coalescence of metal nanoparticles with one another. Whereas totally fused metal nanoparticles retain essentially none of the structural morphology of the original unfused metal nanoparticles (i.e., they resemble bulk metal with minimal grain boundaries), partially fused metal nanoparticles retain at least some of the structural morphology of the original unfused metal nanoparticles and define a grain boundary. The properties of partially fused metal nanoparticles can be intermediate between those of the corresponding bulk metal and the original unfused metal nanoparticles. In some embodiments, fully dense (non-porous) bulk metal can be obtained as a monolithic metal body within a via by the processes described herein. In other embodiments, the bulk metal within a via can have less than about 10% porosity, or less than about 20% porosity, or less than about 30% porosity in an amount above full densification (i.e., >0% porosity). Thus, in particular embodiments, the bulk metal constituting the monolithic metal body may have a porosity ranging from about 2% to about 30%, or about 2% to about 5%, or about 5% to about 10%, or about 10% to about 15%, or about 15% to about 20%, or about 20% to about 25%, or about 25% to about 30%. In a particular example, a monolithic metal body having a uniform porosity of 12% exhibited a thermal conductivity of 277 W/m·K. FIG. 6 shows an SEM image that illustrates porosity in a consolidated copper nanoparticle paste composition.

Figure 5:
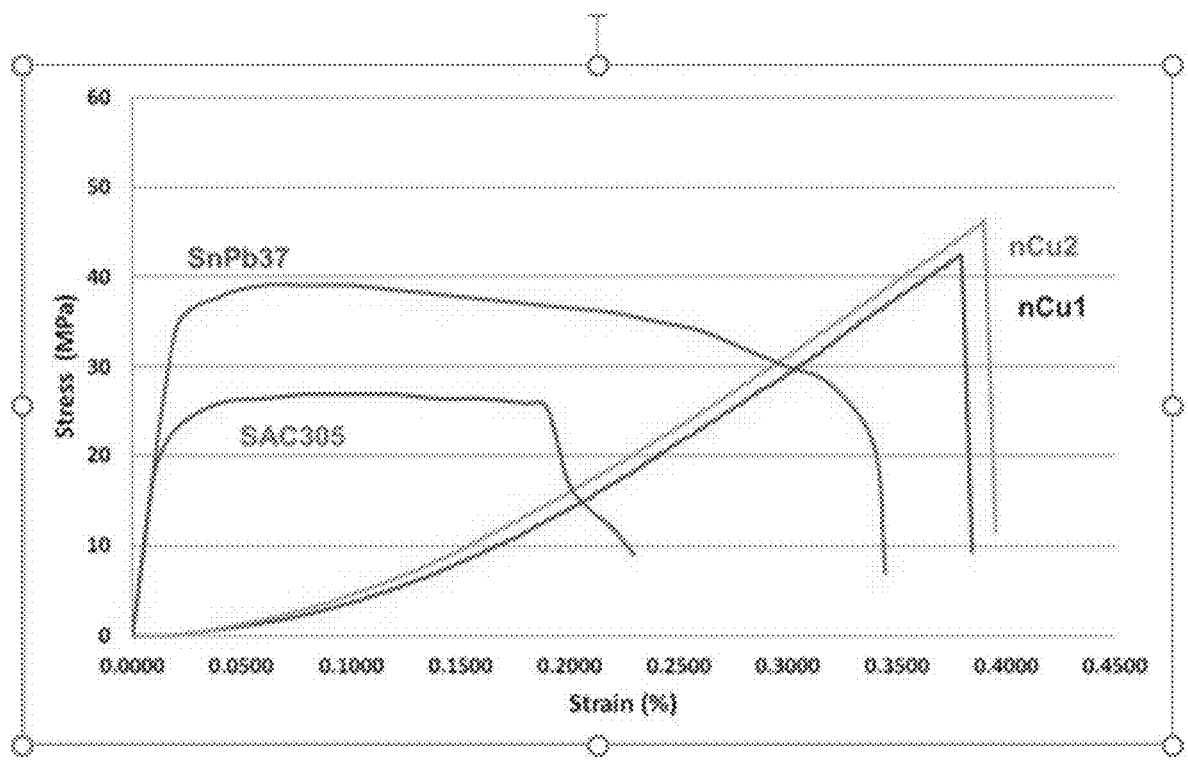
FIG. 5 shows a stress-strain curve for consolidated copper nanoparticles in comparison to other materials frequently used in conjunction with printed circuit board manufacturing.

Before further discussing more particular aspects of the present disclosure in more detail, additional brief description of metal nanoparticles and their processing conditions, particularly copper nanoparticles, will first be provided. Metal nanoparticles exhibit a number of properties that can differ significantly from those of the corresponding bulk metal. One property of metal nanoparticles that can be of particular importance for processing according to the disclosure herein is nanoparticle fusion (consolidation) that occurs at the metal nanoparticles' fusion temperature. As used herein, the term "fusion temperature" refers to the temperature at which a metal nanoparticle liquefies, thereby giving the appearance of melting. As used herein, the terms "fusion" and "consolidation" synonymously refer to the coalescence or partial coalescence of metal nanoparticles with one another to form a larger mass, such as a monolithic metal body filling and extending through a via. Accordingly, there is at least partial connectivity between the metal nanoparticles following heating above the fusion temperature. Following consolidation of the metal nanoparticles, the resulting nanoporosity accommodates thermal stresses occurring during heat-up and cool-down, as shown in FIG. 5, in comparison to other materials commonly employed in PCB manufacturing. As shown, consolidated copper nanoparticles exhibit superior stress-strain behavior compared to other materials commonly used in PCB manufacturing. The resistance to thermomechanical stresses compared to conventional PCB materials, as shown in FIG. 5, is believed to arise from uniform nanoporosity in the 2-30% range, as discussed above. Moreover, nanoporosity in this range may afford ductility and deformation during extreme thermal cycling operations, thereby decreasing a risk of failure.

Upon decreasing in size, particularly below about 20 nm in equivalent spherical diameter, the temperature at which metal nanoparticles undergo liquefication drops dramatically from that of the corresponding bulk metal. For example, copper nanoparticles having a size of about 20 nm or less can have fusion temperatures of about 220° C. or below, or about 200° C. or below, in comparison to bulk copper's melting point of 1083° C. Thus, the consolidation of metal nanoparticles taking place at the fusion temperature can allow structures containing bulk metal to be fabricated at significantly lower processing temperatures than when working directly with the bulk metal itself as a starting material. Processing conditions for consolidating metal nanoparticles are typically within normal PCB manufacturing parameters of around 375° F. and 275-400 psi. In the case of copper nanoparticles, for example, the fusion temperature is below the temperatures at which commonly used PCB substrates undergo melting or distortion. Thus, metal nanoparticles, such as copper nanoparticles, provide a facile material for filling vias in PCBs and forming a monolithic block comprising bulk metal or bulk metal composite without distorting the board or damaging other components on the board. Accordingly, the use of metal nanoparticles according to the disclosure herein does not require development of alternative fabrication lines or materials differing from those conventionally used in PCB manufacturing.

A number of scalable processes for producing bulk quantities of metal nanoparticles in a targeted size range have been developed. Most typically, such processes for producing metal nanoparticles take place by reducing a metal precursor in the presence of one or more surfactants. The metal nanoparticles can then be isolated and purified from the reaction mixture by common isolation techniques and processed into a formulation suitable for dispensation into vias.

Any suitable technique can be employed for forming the metal nanoparticles used in the disclosure herein. Particularly facile metal nanoparticle fabrication techniques are described in U.S. Pat. Nos. 7,736,414, 8,105,414, 8,192,866, 8,486,305, 8,834,747, 9,005,483, 9,095,898, and 9,700,940, each of which is incorporated herein by reference in its entirety. As described therein, metal nanoparticles can be fabricated in a narrow size range by reduction of a metal salt in a solvent in the presence of a suitable surfactant system, which can include one or more different surfactants. Further description of suitable surfactant systems follows below. Without being bound by any theory or mechanism, it is believed that the surfactant system can mediate the nucleation and growth of the metal nanoparticles, limit surface oxidation of the metal nanoparticles, and/or inhibit metal nanoparticles from extensively aggregating with one another prior to being at least partially fused together. Suitable organic solvents for solubilizing metal salts and forming metal nanoparticles can include, for example, formamide, N,N-dimethylformamide, dimethyl sulfoxide, dimethylpropylene urea, hexamethylphosphoramide, tetrahydrofuran, glyme, diglyme, triglyme, tetraglyme, proglyme, or polyglyme. Reducing agents suitable for reducing metal salts and promoting the formation of metal nanoparticles can include, for example, an alkali metal in the presence of a suitable catalyst (e.g., lithium naphthalide, sodium naphthalide, or potassium naphthalide) or borohydride reducing agents (e.g., sodium borohydride, lithium borohydride, potassium borohydride, or tetraalkylammonium borohydrides).

Figure 2:
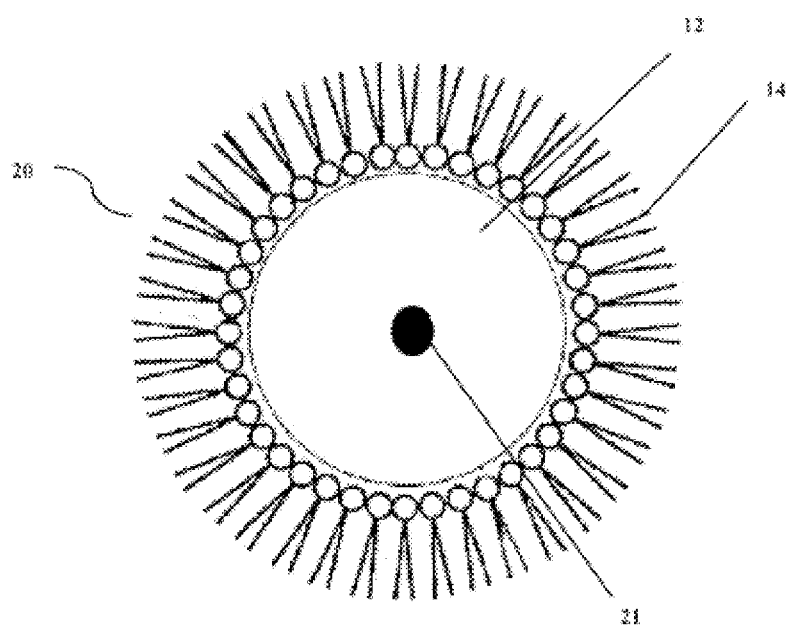

FIGS. 1 and 2 show diagrams of presumed structures of metal nanoparticles having a surfactant coating thereon. As shown in FIG. 1, metal nanoparticle 10 includes metallic core 12 and surfactant layer 14 overcoating metallic core 12. Surfactant layer 14 can contain any combination of surfactants, as described in more detail below. Metal nanoparticle 20, shown in FIG. 2, is similar to that depicted in FIG. 1, except metallic core 12 is grown about nucleus 21, which can be a metal that is the same as or different than that of metallic core 12. Because nucleus 21 is buried deep within metallic core 12 in metal nanoparticle 20 and is very small in size, it is not believed to significantly affect the overall nanoparticle properties. Nucleus 21 may comprise a salt or a metal, wherein the metal may be the same or different than metallic core 12. In some embodiments, the nanoparticles can have an amorphous morphology.

As discussed above, the metal nanoparticles have a surfactant coating containing one or more surfactants upon their surface. The surfactant coating can be formed on the metal nanoparticles during their synthesis. The surfactant coating is generally lost during consolidation of the metal nanoparticles upon heating above the fusion temperature, which results in formation of a monolithic metal body within the one or more vias, according to the embodiments of the present disclosure. Formation of a surfactant coating upon metal nanoparticles during their syntheses can desirably limit the ability of the metal nanoparticles to fuse to one another prematurely, limit agglomeration of the metal nanoparticles, and promote the formation of a population of metal nanoparticles having a narrow size distribution. Porosity values may range from 2-30%, which may be tailored based upon a number of factors, including the type of surfactant(s) that are present.

The types of metal nanoparticles suitable for use in conjunction with the various embodiments of the present disclosure are not believed to be particularly limited. Suitable metal nanoparticles can include, but are not limited to, tin nanoparticles, copper nanoparticles, aluminum nanoparticles, palladium nanoparticles, silver nanoparticles, gold nanoparticles, iron nanoparticles, cobalt nanoparticles, nickel nanoparticles, titanium nanoparticles, zirconium nanoparticles, hafnium nanoparticles, tantalum nanoparticles, and the like. Micron-sized particles of these metals can be present in metal nanoparticle paste compositions containing the metal nanoparticles as well. Copper can be a particularly desirable metal for use in the embodiments of the present disclosure due to its low cost, strength, and excellent electrical and thermal conductivity values.

In various embodiments, the surfactant system present within the metal nanoparticles can include one or more surfactants. The differing properties of various surfactants can be used to tailor the properties of the metal nanoparticles. Factors that can be taken into account when selecting a surfactant or combination of surfactants for inclusion upon the metal nanoparticles can include, for example, ease of surfactant dissipation from the metal nanoparticles during nanoparticle fusion, nucleation and growth rates of the metal nanoparticles, the metal component of the metal nanoparticles, and the like.

In some embodiments, an amine surfactant or combination of amine surfactants, particularly aliphatic amines, can be present upon the metal nanoparticles. Amine surfactants can be particularly desirable for use in conjunction with copper nanoparticles. In some embodiments, two amine surfactants can be used in combination with one another. In other embodiments, three amine surfactants can be used in combination with one another. In more specific embodiments, a primary amine, a secondary amine, and a diamine chelating agent can be used in combination with one another. In still more specific embodiments, the three amine surfactants can include a long chain primary amine, a secondary amine, and a diamine having at least one tertiary alkyl group nitrogen substituent. Further disclosure regarding suitable amine surfactants follows hereinafter.

In some embodiments, the surfactant system can include a primary alkylamine. In some embodiments, the primary alkylamine can be a $C_2$-$C_{18}$ alkylamine. In some embodiments, the primary alkylamine can be a $C_7$-$C_{10}$ alkylamine. In other embodiments, a $C_5$-$C_6$ primary alkylamine can also be used. Without being bound by any theory or mechanism, the exact size of the primary alkylamine can be balanced between being long enough to provide an effective inverse micelle structure during synthesis versus having ready volatility and/or ease of handling during nanoparticle consolidation. For example, primary alkylamines with more than 18 carbons can also be suitable for use in the present embodiments, but they can be more difficult to handle because of their waxy character. $C_7$-$C_{10}$ primary alkylamines, in particular, can represent a good balance of desired properties for ease of use.

In some embodiments, the $C_2$-$C_{18}$ primary alkylamine can be n-hexylamine, n-heptylamine, n-octylamine, n-nonylamine, or n-decylamine, for example. While these are all straight chain primary alkylamines, branched chain primary alkylamines can also be used in other embodiments. For example, branched chain primary alkylamines such as, for example, 7-methyloctylamine, 2-methyloctylamine, or 7-methylnonylamine can be used. In some embodiments, such branched chain primary alkylamines can be sterically hindered where they are attached to the amine nitrogen atom. Non-limiting examples of such sterically hindered primary alkylamines can include, for example, t-octylamine, 2-methylpentan-2-amine, 2-methylhexan-2-amine, 2-methylheptan-2-amine, 3-ethyloctan-3-amine, 3-ethylheptan-3-amine, 3-ethylhexan-3-amine, and the like. Additional branching can also be present. Without being bound by any theory or mechanism, it is believed that primary alkylamines can serve as ligands in the metal coordination sphere but be readily dissociable therefrom during metal nanoparticle consolidation.

In some embodiments, the surfactant system can include a secondary amine. Secondary amines suitable for forming metal nanoparticles can include normal, branched, or cyclic $C_4$-$C_{12}$ alkyl groups bound to the amine nitrogen atom. In some embodiments, the branching can occur on a carbon atom bound to the amine nitrogen atom, thereby producing significant steric encumbrance at the nitrogen atom. Suitable secondary amines can include, without limitation, dihexylamine, diisobutylamine, di-t-butylamine, dineopentylamine, di-t-pentylamine, dicyclopentylamine, dicyclohexylamine, and the like. Secondary amines outside the $C_4$-$C_{12}$ range can also be used, but such secondary amines can have undesirable physical properties such as low boiling points or waxy consistencies that can complicate their handling.

In some embodiments, the surfactant system can include a chelating agent, particularly a diamine chelating agent. In some embodiments, one or both of the nitrogen atoms of the diamine chelating agent can be substituted with one or two alkyl groups. When two alkyl groups are present on the same nitrogen atom, they can be the same or different. Further, when both nitrogen atoms are substituted, the same or different alkyl groups can be present. In some embodiments, the alkyl groups can be $C_1$-$C_6$ alkyl groups. In other embodiments, the alkyl groups can be $C_1$-$C_4$ alkyl groups or $C_3$-$C_6$ alkyl groups. In some embodiments, $C_3$ or higher alkyl groups can be straight or have branched chains. In some embodiments, $C_3$ or higher alkyl groups can be cyclic.

Without being bound by any theory or mechanism, it is believed that diamine chelating agents can facilitate metal nanoparticle formation by promoting nanoparticle nucleation.

In some embodiments, suitable diamine chelating agents can include N,N'-dialkylethylenediamines, particularly $C_1$-$C_4$ N,N'-dialkylethylenediamines. The corresponding methylenediamine, propylenediamine, butylenediamine, pentylenediamine or hexylenediamine derivatives can also be used. The alkyl groups can be the same or different. $C_1$-$C_4$ alkyl groups that can be present include, for example, methyl, ethyl, propyl, and butyl groups, or branched alkyl groups such as isopropyl, isobutyl, s-butyl, and t-butyl groups. Illustrative N,N'-dialkylethylenediamines that can be suitable for inclusion upon metal nanoparticles include, for example, N,N'-di-t-butylethylenediamine, N,N'-diisopropylethylenediamine, and the like.

In some embodiments, suitable diamine chelating agents can include N,N,N',N'-tetraalkylethylenediamines, particularly $C_1$-$C_4$ N,N,N',N'-tetraalkylethylenediamines. The corresponding methylenediamine, propylenediamine, butylenediamine, pentylenediamine or hexylenediamine derivatives can also be used. The alkyl groups can again be the same or different and include those mentioned above. Illustrative N,N,N',N'-tetraalkylethylenediamines that can be suitable for use in forming metal nanoparticles include, for example, N,N,N',N'-tetramethylethylenediamine, N,N,N',N'-tetraethylethylenediamine, and the like.

Surfactants other than aliphatic amines can also be present in the surfactant system. In this regard, suitable surfactants can include, for example, pyridines, aromatic amines, phosphines, thiols, or any combination thereof. These surfactants can be used in combination with an aliphatic amine, including those described above, or they can be used in a surfactant system in which an aliphatic amine is not present. Further disclosure regarding suitable pyridines, aromatic amines, phosphines, and thiols follows below.

Suitable aromatic amines can have a formula of $ArNR^1R^2$, where Ar is a substituted or unsubstituted aryl group and $R^1$ and $R^2$ are the same or different. $R^1$ and $R^2$ can be independently selected from H or an alkyl or aryl group containing from 1 to about 16 carbon atoms. Illustrative aromatic amines that can be suitable for use in forming metal nanoparticles include, for example, aniline, toluidine, anisidine, N,N-dimethylaniline, N,N-diethylaniline, and the like. Other aromatic amines that can be used in conjunction with metal nanoparticles can be envisioned by one having ordinary skill in the art.

Suitable pyridines can include both pyridine and its derivatives. Illustrative pyridines that can be suitable for use inclusion upon metal nanoparticles include, for example, pyridine, 2-methylpyridine, 2,6-dimethylpyridine, collidine, pyridazine, and the like. Chelating pyridines such as bipyridyl chelating agents may also be used. Other pyridines that can be used in conjunction with metal nanoparticles can be envisioned by one having ordinary skill in the art.

Suitable phosphines can have a formula of $PR_3$, where R is an alkyl or aryl group containing from 1 to about 16 carbon atoms. The alkyl or aryl groups attached to the phosphorus center can be the same or different. Illustrative phosphines that can be present upon metal nanoparticles include, for example, trimethylphosphine, triethylphosphine, tributylphosphine, tri-t-butylphosphine, trioctylphosphine, triphenylphosphine, and the like. Phosphine oxides can also be used in a like manner. In some embodiments, surfactants that contain two or more phosphine groups configured for forming a chelate ring can also be used.

Illustrative chelating phosphines can include 1,2-bisphosphines, 1,3-bisphosphines, and bis-phosphines such as BINAP, for example. Other phosphines that can be used in conjunction with metal nanoparticles can be envisioned by one having ordinary skill in the art.

Suitable thiols can have a formula of RSH, where R is an alkyl or aryl group having from about 4 to about 16 carbon atoms. Illustrative thiols that can present upon metal nanoparticles include, for example, butanethiol, 2-methyl-2-propanethiol, hexanethiol, octanethiol, benzenethiol, and the like. In some embodiments, surfactants that contain two or more thiol groups configured for forming a chelate ring can also be used. Illustrative chelating thiols can include, for example, 1,2-dithiols (e.g., 1,2-ethanethiol) and 1,3-dithiols (e.g., 1,3-propanethiol). Other thiols that can be used in conjunction with metal nanoparticles can be envisioned by one having ordinary skill in the art.

As mentioned above, a distinguishing feature of metal nanoparticles is their low fusion temperature, which may facilitate via filling to establish an effective thermal conduction pathway therein, according to the various embodiments of the present disclosure. In order to facilitate their disposition and formation of a monolithic metal body within the vias, the metal nanoparticles may be incorporated in a paste or similar formulation suitable for controlled introduction into the vias. Additional disclosure directed to metal nanoparticle paste compositions and similar formulations follows hereinbelow.

Metal nanoparticle paste compositions or similar formulations can be prepared by dispersing as-produced or as-isolated metal nanoparticles in an organic matrix containing one or more organic solvents and various other optional components. As used herein, the terms "nanoparticle paste formulation," "nanoparticle paste composition" and grammatical equivalents thereof are used interchangeably and refer synonymously to a fluid composition containing dispersed metal nanoparticles that is suitable for dispensation using a desired technique. Use of the term "paste" does not necessarily imply an adhesive function of the paste alone. Through judicious choice of the organic solvent(s) and other additives, the loading of metal nanoparticles and the like, ready dispensation of the metal nanoparticles within one or more vias may be promoted.

Cracking can sometimes occur during consolidation of the metal nanoparticles. One way in which the nanoparticle pastes of the present disclosure can promote a decreased degree of cracking and void formation following metal nanoparticle consolidation is by maintaining a high solids content. More particularly, in some embodiments, the paste compositions can contain at least about 30% metal nanoparticles by weight, particularly about 30% to about 98% metal nanoparticles by weight of the paste composition, or about 50% to about 95% metal nanoparticles by weight of the paste composition, or about 70% to about 98% metal nanoparticles by weight of the paste composition. Moreover, in some embodiments, small amounts (e.g., about 0.01% to about 15% or about 35% or about 60% by weight of the paste composition) of micron-scale metal particles can be present in addition to the metal nanoparticles. Such micron-scale metal particles can desirably promote the fusion of metal nanoparticles into a contiguous mass (monolithic metal body) and further reduce the incidence of cracking. Instead of being liquefied and undergoing direct consolidation as is the case for the metal nanoparticles, the micron-scale metal particles can simply become joined together upon being contacted with liquefied metal nanoparticles that have been raised above their fusion temperature. These factors can reduce the porosity that results after fusing the metal nanoparticles together. The micron-scale metal particles can contain the same or different metals than the metal nanoparticles, and suitable metals for the micron-scale particles can include, for example, copper, silver, gold, aluminum, tin, and the like. Micron-scale graphite particles may also be included, in some embodiments. Carbon nanotubes, diamond particles, and/or graphene may be included, in some embodiments. Carbonaceous additives may increase the thermal conductivity resulting after metal nanoparticle consolidation takes place, according to some embodiments.

Decreased cracking and void formation during metal nanoparticle consolidation can also be promoted by judicious choice of the solvent(s) forming the organic matrix. A tailored combination of organic solvents can desirably decrease the incidence of cracking and void formation. More particularly, an organic matrix containing one or more hydrocarbons (saturated, monounsaturated, polyunsaturated (2 or more double bonds) or aromatic), one or more alcohols, one or more amines, and one or more organic acids can be especially effective for this purpose. One or more esters and/or one or more anhydrides may be included, in some embodiments. Without being bound by any theory or mechanism, it is believed that this combination of organic solvents can facilitate the removal and sequestration of surfactant molecules surrounding the metal nanoparticles during consolidation, such that the metal nanoparticles can more easily fuse together with one another. More particularly, it is believed that hydrocarbon and alcohol solvents can passively solubilize surfactant molecules released from the metal nanoparticles by Brownian motion and reduce their ability to become re-attached thereto. In concert with the passive solubilization of surfactant molecules, amine and organic acid solvents can actively sequester the surfactant molecules through a chemical interaction such that they are no longer available for recombination with the metal nanoparticles.

Further tailoring of the solvent composition can be performed to reduce the suddenness of volume contraction that takes place during surfactant removal and metal nanoparticle consolidation. Specifically, more than one member of each class of organic solvent (i.e., hydrocarbons, alcohols, amines, and organic acids), can be present in the organic matrix, where the members of each class have boiling points that are separated from one another by a set degree. For example, in some embodiments, the various members of each class can have boiling points that are separated from one another by about 20° C. to about 50° C. By using such a solvent mixture, sudden volume changes due to rapid loss of solvent can be minimized during metal nanoparticle consolidation, since the various components of the solvent mixture can be removed gradually over a broad range of boiling points (e.g., about 50° C. to about 200° C.).

In various embodiments, at least some of the one or more organic solvents can have a boiling point of about 100° C. or greater. In other various embodiments, at least some of the one or more organic solvents can have a boiling point of about 200° C. or greater. In some or other embodiments, the one or more organic solvents can have boiling points ranging between about 50° C. and about 200° C., or between about 50° C. and about 250° C., or between about 50° C. and about 300° C., or between about 50° C. and about 350° C. Use of high boiling organic solvents can desirably increase the pot life of the metal nanoparticle paste compositions and limit the rapid loss of solvent, which can lead to cracking and void formation during nanoparticle consolidation. In some embodiments, at least one of the organic solvents can have a boiling point that is higher than the boiling point(s) of the surfactant(s) associated with the metal nanoparticles. Accordingly, surfactant(s) can be removed from the metal nanoparticles by evaporation before removal of the organic solvent(s) takes place.

In some embodiments, the organic matrix can contain one or more alcohols, which may be $C_2$-$C_{12}$, $C_4$-$C_{12}$ or $C_7$-$C_{12}$ in more particular embodiments. In various embodiments, the alcohols can include monohydric alcohols, diols, or triols. One or more glycol ethers (e.g., diethylene glycol and triethylene glycol), alkanolamines (e.g., ethanolamine, triethanolamine, and the like), or any combination thereof may be present in certain embodiments, which may be present alone or in combination with other alcohols. Various glymes may be present with the one or more alcohols in some embodiments. In some embodiments, one or more hydrocarbons can be present in combination with one or more alcohols. As discussed above, it is believed that alcohol (and optionally glymes and alkanolamines) and hydrocarbon solvents can passively promote the solubilization of surfactants as they are removed from the metal nanoparticles by Brownian motion and limit their re-association with the metal nanoparticles. Moreover, hydrocarbon and alcohol solvents only weakly coordinate with metal nanoparticles, so they do not simply replace the displaced surfactants in the nanoparticle coordination sphere. Illustrative but non-limiting examples of alcohol and hydrocarbon solvents that can be present include, for example, light aromatic petroleum distillate (CAS 64742-95-6), hydrotreated light petroleum distillates (CAS 64742-47-8), tripropyleneglycol methyl ether, ligroin (CAS 68551-17-7, a mixture of $C_{10}$-$C_{13}$ alkanes), diisopropyleneglycol monomethyl ether, diethyleneglycol diethyl ether, 2-propanol, 2-butanol, t-butanol, 1-hexanol, 2-(2-butoxyethoxy)ethanol, and terpineol. In some embodiments, polyketone solvents can be used in a like manner.

In some embodiments, the organic matrix can contain one or more amines and one or more organic acids. In some embodiments, the one or more amines and one or more organic acids can be present in an organic matrix that also includes one or more hydrocarbons and one or more alcohols. As discussed above, it is believed that amines and organic acids can actively sequester surfactants that have been passively solubilized by hydrocarbon and alcohol solvents, thereby making the surfactants unavailable for re-association with the metal nanoparticles. Thus, an organic solvent that contains a combination of one or more hydrocarbons, one or more alcohols, one or more amines, and one or more organic acids can provide synergistic benefits for promoting the consolidation of metal nanoparticles. Illustrative but non-limiting examples of amine solvents that can be present include, for example, tallowamine (CAS 61790-33-8), alkyl ($C_8$-$C_{18}$) unsaturated amines (CAS 68037-94-5), di(hydrogenated tallow)amine (CAS 61789-79-5), dialkyl ($C_8$-$C_{20}$) amines (CAS 68526-63-6), alkyl ($C_{10}$-$C_{16}$) dimethyl amine (CAS 67700-98-5), alkyl ($C_{14}$-$C_{18}$) dimethyl amine (CAS 68037-93-4), dihydrogenated tallowmethyl amine (CAS 61788-63-4), and trialkyl ($C_6$-$C_{12}$) amines (CAS 68038-01-7). Illustrative but non-limiting examples of organic acid solvents that can be present in the nanoparticle paste compositions include, for example, octanoic acid, nonanoic acid, decanoic acid, caprylic acid, pelargonic acid, undecylic acid, lauric acid, tridecylic acid, myristic acid, pentadecanoic acid, palmitic acid, margaric acid, stearic acid, nonadecylic acid, α-linolenic acid, stearidonic acid, oleic acid, and linoleic acid.

In some embodiments, the organic matrix can include more than one hydrocarbon, more than one alcohol, optionally more than one glyme (glycol ether), more than one amine, and more than one organic acid. For example, in some embodiments, each class of organic solvent can have two or more members, or three or more members, or four or more members, or five or more members, or six or more members, or seven or more members, or eight or more members, or nine or more members, or ten or more members. Moreover, the number of members in each class of organic solvent can be the same or different. Particular benefits of using multiple members of each class of organic solvent are described hereinafter.

One particular advantage of using multiple members within each class of organic solvent can include the ability to provide a wide spread of boiling points in the metal nanoparticle paste compositions. By providing a wide spread of boiling points, the organic solvents can be removed gradually as the temperature rises while affecting metal nanoparticle consolidation, thereby limiting volume contraction and disfavoring cracking. By gradually removing the organic solvent in this manner, less temperature control may be needed to affect slow solvent removal than if a single solvent with a narrow boiling point range was used. In some embodiments, the members within each class of organic solvent can have a window of boiling points ranging between about 50° C. and about 200° C., or between about 50° C. and about 250° C., or between about 100° C. and about 200° C., or between about 100° C. and about 250° C., or between about 150° C. and about 300° C., or between about 150° C. and about 350° C. In more particular embodiments, the various members of each class of organic solvent can each have boiling points that are separated from one another by at least about 20° C., specifically about 20° C. to about 50° C. More specifically, in some embodiments, each hydrocarbon can have a boiling point that differs by about 20° C. to about 50° C. from other hydrocarbons in the organic matrix, each alcohol can have a boiling point that differs by about 20° C. to about 50° C. from other alcohols in the organic matrix, each amine can have a boiling point that differs by about 20° C. to about 50° C. from other amines in the organic matrix, and each organic acid can have a boiling point that differs by about 20° C. to about 50° C. from other organic acids in the organic matrix. The more members of each class of organic solvent that are present, the smaller the differences become between the boiling points. By having smaller differences between the boiling points, solvent removal can be made more continual, thereby limiting the degree of volume contraction that occurs at each stage. A reduced degree of cracking can occur when four to five or more members of each class of organic solvent are present (e.g., four or more hydrocarbons, four or more alcohols, four or more amines, and four or more organic acids; or five or more hydrocarbons, five or more alcohols, five or more amines, and five or more organic acids), each having boiling points that are separated from one another within the above range.

In various embodiments, the metal nanoparticles used in the metal nanoparticle paste compositions can be about 20 nm or less in size. In other various embodiments, metal nanoparticles may be up to about 75 nm in size. As discussed above, metal nanoparticles in this size range have fusion temperatures that are significantly lower than those of the corresponding bulk metal and readily undergo consolidation with one another as a result. In some embodiments, metal nanoparticles that are about 20 nm or less in size can have a fusion temperature of about 220° C. or below (e.g., a fusion temperature in the range of about 140° C. to about 220° C.) or about 200° C. or below, which can provide advantages that are noted above. In some embodiments, at least a portion of the metal nanoparticles can be about 10 nm or less in size, or about 5 nm or less in size. In more specific embodiments, at least a portion of the metal nanoparticles can range from about 1 nm in size to about 20 nm in size, or from about 1 nm in size and about 10 nm in size, or from about 1 nm in size to about 5 nm in size, or from about 3 nm in size to about 7 nm in size, or from about 5 nm in size to about 20 nm in size. In some embodiments, substantially all of the metal nanoparticles can reside within these size ranges. In some embodiments, larger metal nanoparticles can be combined in the metal nanoparticle paste compositions with metal nanoparticles that are about 20 nm in size or less. For example, in some embodiments, metal nanoparticles ranging from about 1 nm to about 10 nm in size can be combined with metal nanoparticles that range from about 25 nm to about 50 nm in size, or with metal nanoparticles that range from about 25 nm to about 100 nm in size. As further discussed below, micron-scale metal particles and/or nanoscale particles can also be included in the metal nanoparticle paste compositions in some embodiments. Although larger metal nanoparticles and micron-scale metal particles may not be liquefiable the low temperatures of their smaller counterparts, they can still become consolidated upon contacting the smaller metal nanoparticles that have been liquefied at or above their fusion temperature, as generally discussed above.

In addition to metal nanoparticles and organic solvents, other additives can also be present in the metal nanoparticle paste compositions. Such additional additives can include, for example, rheology control aids, thickening agents, micron-scale conductive additives, nanoscale conductive additives, and any combination thereof. Chemical additives can also be present. As discussed hereinafter, the inclusion of micron-scale conductive additives, such as micron-scale metal particles, can be particularly advantageous. Nanoscale or micron-scale diamond or other thermally conductive additives may be desirable to include in some instances for promoting more efficient heat transfer.

In some embodiments, the paste compositions can contain about 0.01% to about 15% micron-scale metal particles by weight, or about 1% to about 10% micron-scale metal particles by weight, or about 1% to about 5% micron-scale metal particles by weight, or about 0.1% to about 35% micron-scale metal particles by weight. Inclusion of micron-scale metal particles in the metal nanoparticle paste compositions can desirably reduce the incidence of cracking that occurs during consolidation of the metal nanoparticles when forming a monolithic metal body. Without being bound by any theory or mechanism, it is believed that the micron-scale metal particles can become consolidated with one another as the metal nanoparticles are liquefied and form a transient liquid coating upon the surface of the micron-scale metal particles. In some embodiments, the micron-scale metal particles can range from about 500 nm to about 100 microns in size in at least one dimension, or from about 500 nm to about 10 microns in size in at least one dimension, or from about 100 nm to about 5 microns in size in at least one dimension, or from about 100 nm to about 10 microns in size in at least one dimension, or from about 100 nm to about 1 micron in size in at least one dimension, or from about 1 micron to about 10 microns in size in at least one dimension, or from about 5 microns to about 10 microns in size in at least one dimension, or from about 1 micron to about 100 microns in size in at least one dimension. The micron-size metal particles can contain the same metal as the metal nanoparticles or contain a different metal. Thus, metal alloys can be fabricated by including micron-size metal particles in the paste compositions with a metal differing from that of the metal nanoparticles. Metal alloys may also be formed by combining different types of metal nanoparticles with one another. Suitable micron-scale metal particles can include, for example, Cu, Ni, Al, Fe, Co, Mo, Ag, Zn, Sn, Au, Pd, Pt, Ru, Mn, Cr, Ti, V, Mg or Ca particles. Non-metal particles such as, for example, Si and B micron-scale particles can be used in a like manner. In some embodiments, the micron-scale metal particles can be in the form of metal flakes, such as high aspect ratio copper flakes, for example. Thus, in some embodiments, the metal nanoparticle paste compositions described herein can contain a mixture of copper nanoparticles and high aspect ratio copper flakes or another type of micron-scale copper particles. Specifically, in some embodiments, the metal nanoparticle paste compositions can contain about 30% to about 90% copper nanoparticles by weight and about 0.01% to about 15% or 1% to about 35% high aspect ratio copper flakes by weight.

Other micron-scale metal particles that can be used equivalently to high aspect ratio metal flakes include, for example, metal nanowires and other high aspect ratio particles, which can be up to about 300 microns in length. The ratio of metal nanoparticles to metal nanowires may range between about 10:1 to about 40:1, according to various embodiments. Suitable nanowires may have a length of about 5 microns to about 50 microns, and a diameter of about 100 nm to about 200 nm, for example.

In some embodiments, nanoscale conductive additives can also be present in the metal nanoparticle paste compositions. These additives can desirably provide further structural stabilization and reduce shrinkage during metal nanoparticle consolidation. Moreover, inclusion of nanoscale conductive additives can increase electrical and thermal conductivity values that can approach or even exceed that of the corresponding bulk metal following nanoparticle consolidation, which can be desirable for promoting heat transfer according to the disclosure herein. In some embodiments, the nanoscale conductive additives can have a size in at least one dimension ranging from about 1 micron to about 100 microns or ranging from about 1 micron to about 300 microns. Suitable nanoscale conductive additives can include, for example, carbon nanotubes, graphene, nanodiamond, and the like. When present, the metal nanoparticle paste compositions can contain about 1% to about 10% nanoscale conductive additives by weight, or about 1% to about 5% nanoscale conductive additives by weight.

Additional substances that can also optionally be present in the metal nanoparticle paste compositions include, for example, flame retardants, UV protective agents, antioxidants, carbon black, graphite, fiber materials (e.g., chopped carbon fiber materials), diamond, and the like.

In some more specific embodiments, suitable nanoparticle paste compositions may further comprise diamond particles. A suitable size of diamond particles may be dictated by the size of the via to be filled. In general, diamond particles smaller in size than the diameter of the via may be selected so that the diamond particles can successfully enter the via. Moreover, the diamond particles may be sized as large as possible, taking into account the diameter of the via, to limit grain boundaries that need to be crossed by phonons during heat transfer. The size of the diamond particles may remain sufficiently small such that dispensability of the metal nanoparticle paste composition is not compromised.

In still more specific embodiments, diamond particles suitable for use in the metal nanoparticle paste compositions may have a size ranging from about 1 micron to about 1000 microns, which can provide for good particle dispersion and acceptable paste dispensibility. Diamond particles having a size ranging from about 200 microns to about 250 microns can represent a good compromise between providing effective dispersion and a minimized grain boundary for discouraging phonon scattering. Other suitable size ranges for the diamond particles can range from about 25 microns to about 150 microns, or about 50 microns to about 250 microns, or from about 100 microns to about 250 microns, or from about 100 microns to about 200 microns, or from about 150 microns to about 250 microns.

In illustrative embodiments, the vias can include about 10% to about 75% diamond particles by volume after metal nanoparticle consolidation has taken place to form a monolithic metal body. That is, according to some embodiments of the present disclosure, the vias may be filled with a monolithic metal body that is a metal-diamond composite, wherein the metal-diamond composite extends longitudinally through a via from a first face to a second face of the PCB.

Admixture of copper nanoparticles and diamond particles may be desirable for filling vias for several reasons. Copper is low in cost compared to most other metals, is impedance matched relatively well with diamond, and bears high thermal conductivity on its own. In some embodiments, impedance matching can be further improved by including a carbide-forming additive to form a thin layer (single atom to <10 nm thick layer) of carbide upon the diamond particles. As such, the combination of copper nanoparticles and diamond particles can provide very effective heat transfer in the various embodiments of the present disclosure. In the case where the vias also establish electronic communication between various board layers, copper also affords high electrical conductivity as well.

Nanoparticle paste compositions suitable for use in filling vias or similar conduits according to the present disclosure can be formulated using any of the metal nanoparticle paste compositions described hereinabove. In addition, according to some embodiments, multiple metals may be present in the metal nanoparticle paste compositions. In some or other embodiments, suitable metal nanoparticle paste compositions can include a mixture of metal nanoparticles, other nano-sized particles (i.e., particles having a dimension of about 100 nm or less), and/or micron-sized particles. The metal nanoparticle paste compositions may comprise copper nanoparticles, according to more specific embodiments.

In various embodiments of the present disclosure, new or previously existing vias in a circuit board (e.g., a PCB) may be filled with metal nanoparticles, which undergo subsequent consolidation. The metal nanoparticles may be contained within a metal nanoparticle paste composition. The metal nanoparticle composition is subsequently processed to promote at least partial consolidation of the metal nanoparticles within the vias to form a monolithic metal body (a continuous mass of bulk metal) that fills the vias and extends between opposing faces of the circuit board. For example, according to various embodiments, the metal nanoparticles may be heated at or above the fusion temperature while located within the via to form the monolithic metal body. Alternately, pressure may be applied to promote metal nanoparticle consolidation within the vias. Once the monolithic metal body has been formed within the vias, one or both ends of the monolithic metal body may be connected to a heat sink or like heat dissipation apparatus of various types. The vias and the monolithic metal bodies extend between the first and second faces of the circuit board, thereby allowing excess heat to be shunted from one side of the circuit board to the other.

Vias are easily integrated into a PCB and may be drilled out after initial assembly. Alternately, vias extending through the PCB may be defined during lamination of the substrate layers in multi-layer PCBs. The vias can have a range of sizes, of they can all be substantially the same size. The size range of the vias that may be filled with metal nanoparticles according to the present disclosure is not considered to be particularly limited and may range from micron-sized up to sizes larger than one millimeter or more. According to more specific embodiments, the vias can range in size (diameter) from about 100 microns up to about 30 mm or 50 mm. In still more specific embodiments, the vias can range from about 1 mm to about 10 mm, or from 1 mm to about 8 mm, or from about 1 mm to about 5 mm, or from about 2 mm to about 5 mm, or from about 3 mm to about 10 mm, or from about 2 mm to about 15 mm, or from about 3 mm to about 15 mm. In some embodiments, at least a portion of the vias may be about 5 mm or less in size. In some or other embodiments, at least a portion of the vias may be about 2 mm to about 10 mm in size, or about 3 mm to about 10 mm in size, or about 4 mm to about 12 mm in size. The size(s) of the vias may dictate to some degree the manner in which they are filled with a metal nanoparticle paste composition, such as a copper nanoparticle paste composition.

Suitable vias may have any cross-sectional profile as they extend through the PCB. According to some embodiments, the vias may have a round cross-sectional profile; thus, such vias have a cylindrical shape. Other suitable via cross-sectional profiles include, but are not limited to, square, rectangular, triangular, ovular, or other regular or irregular geometric shapes. The cross-sectional profile of the vias may be substantially equal in size upon both faces of the PCB, or the cross-sectional profiles may differ in size, according to some embodiments. That is, the vias may be tapered, in some embodiments. For example, in some embodiments, suitable vias may have a conical shape, which may allow greater heat dissipation to take place on one side of the PCB. Specifically, a conical-shaped via may function as an internal heat spreader, according to various embodiments.

In still further embodiments, the PCBs described herein may also include vias that extend laterally within the PCB (i.e., extending parallel to the first and second faces of the PCB substrate), as opposed to the through-plane vias described above. The vias extending laterally may likewise be filled with a metal nanoparticle paste composition, which may then be consolidated to a monolithic metal body, which may then be used for promoting lateral heat transfer. As such, PCBs containing lateral vias may be connected laterally to a heat sink in addition to being coupled to a heat sink at one or both of the PCB faces (i.e., in thermal contact with the through-plane vias). The heat sink connected laterally to the lateral vias of the PCBs may be the same heat sink connected to the through-plane vias or a different heat sink, according to various embodiments.

The PCBs and vias incorporated therein may be single-layer or multi-layer, according to various embodiments. Multi-layer PCBs can contain individual layers that are laminated together to define the vias and other board features. Both single-layer and multi-layer PCBs may be formed initially without the through-plane vias being present, in which case the vias may then be drilled after fabrication of the board is complete.

Once the vias have been filled and the metal nanoparticles undergo at least partial consolidation (e.g., by heating to at least the fusion temperature and/or by applying pressure) to form a monolithic metal body in the form of a continuous mass, plug, rod, wire, or similar body that extends completely from one face of the PCB to the other. The monolithic metal body within the via may contain additional conductive additives, such as graphene, carbon nanotubes, micron-sized diamond, or the like to further aid in promoting thermal conductivity, wherein the conductive additives are introduced to the vias with the metal nanoparticles (e.g., within a metal nanoparticle paste composition). Once formed, one or both ends of the monolithic metal body may be connected to a heat sink to promote thermal transfer from the PCB. In more specific embodiments, the top face of the PCB can be connected to a first heat sink (active or passive heat dissipation device), as done for conventional PCB components, and the bottom face of the PCB can be connected to a second heat sink (active or passive heat dissipation device). Thus, the metal-filled vias produced by the processes described herein may allow at least a portion of the excess heat produced on the front side of the PCB to be conveyed to the backside of the PCB, whereupon it can be removed by the second heat sink. In more specific embodiments, the second heat sink on the second face of the PCB can be another heat sink with a fan, a liquid cooling device microchannel device, or any combination thereof. Since the second heat sink is generally located near the chassis and is thereby nearer a larger bonding frame, it can be connected directly to the casing and further to the outside of a device, thereby allowing for more powerful heat dissipation methods to be used. This type of configuration may be especially effective for server farms. For example, in the case of a computer casing housing a circuit board, the computer casing may function as a large-area passive heat dissipation device to facilitate thermal management. Heat pipes sized for use with a PCB may also be suitable for use in some embodiments. Provided that vibrations are effectively dampened, heat straps may also be used.

Alternately, one of the heat sinks may be placed in proximity to the first face of the second face and the other heat sink may be in contact with the first face and the second face. Thus, one of the heat sinks may be in contact with an electronic component of the PCB producing excess heat, and the other of the heat sinks may be located on the opposite face of the PCB, thereby allowing dissipation of the excess heat to take place from both faces of the PCB. The two heat sinks may dissipate excess heat by the same mechanism or by different mechanisms.

Thus, according to various embodiments of the present disclosure, a heat sink may be thermally coupled to one or both faces of a PCB, with each heat sink being in contact with a face of the PCB substrate or in proximity to a face of the PCB substrate. At least one of the heat sinks contacts the monolithic metal bodies defined within the via. When multiple heat sinks are present, one heat sink can be active and the other passive, both heat sinks can be active, or both heat sinks can be passive. The heat sink(s) may directly contact the monolithic metal bodies in particular embodiments of the present disclosure. In some or other particular embodiments, the heat sink(s) may feature a direct metallurgical bond to one or both faces of the monolithic metal bodies. Direct metallurgical bonds may be produced by contacting the heat sink with the metal nanoparticle paste composition prior to consolidation to form the monolithic metal bodies.

Therefore, according to various embodiments of the present disclosure, printed circuit boards described herein may comprise a substrate having one or more vias extending therethrough between a first face and a second face, a monolithic metal body formed from metal nanoparticles filling each of the one or more vias, and heat sink upon at least one of the first face or the second face, such that the heat sink directly contacts the monolithic metal bodies upon at least one face of the PCB. In particular embodiments, the porosity of the monolithic metal body in the PCB may range from about 2% to about 30% or any subrange thereof, as discussed in more detail above.

The heat sink may be directly built on top of the via surface using additive manufacturing using the same or a different metal nanoparticle composition. This approach may afford direct intimate thermal contact without an additional thermal interface to reduce heat transfer efficiency. In more particular embodiments, as discussed above, the heat sink may feature a direct metallurgical bond to the monolithic metal body.

In more particular embodiments, a first heat sink may be located upon or adjacent to the first face and a second heat sink may be located upon or adjacent to the second face. One of the first heat sink or the second heat sink may contact a heat-producing electronic component, for example, and shunt excess heat from the PCB without that portion of the excess heat passing through the PCB substrate. The other of the first heat sink and the second heat sink may dissipate excess heat conveyed to the opposite face of the PCB substrate. The first heat sink and the second heat sink may dissipate heat by different mechanisms, according to some embodiments.

In more particular embodiments, the monolithic metal body may comprise copper and be formed from copper nanoparticles.

In some or other more particular embodiments, the monolithic metal body may further comprise a plurality of diamond particles or other types of highly conductive particles (e.g., carbon nanotubes, graphene, or the like).

In some embodiments, at least a portion of the one or more vias may contain a reinforcement material. As discussed above, the reinforcement material may aid in retaining the metal nanoparticles within the one or more vias prior to consolidation of the metal nanoparticles taking place. Suitable reinforcement materials are considered in more detail below. The reinforcement material may extend through all or part of the monolithic metal body once metal nanoparticle consolidation has taken place.

Methods of the present disclosure may comprise providing a printed circuit board (PCB) defined upon a substrate and having one or more vias extending through the substrate between a first face and a second face, filling the one or more vias with a metal nanoparticle paste composition, consolidating metal nanoparticles of the metal nanoparticle paste composition within the one or more vias to form a monolithic metal body filling each of the one or more vias, and placing a heat sink upon at least of the first face or the second face, such that the heat sink contacts each monolithic metal body. The metal nanoparticles may comprise copper nanoparticles in more specific embodiments of the present disclosure. The metal nanoparticle paste composition may be adapted to limit shrinkage during consolidation in particular embodiments of the present disclosure, as referenced above.

Suitable metal nanoparticle paste compositions are described in more detail above. In more particular embodiments, the metal nanoparticle paste compositions used for filling the one or more vias may comprise metal nanoparticles (e.g., copper nanoparticles) and at least one additive selected from the group consisting of diamond particles, micron-scale metal particles, and any combination thereof. As discussed above, it may be particularly advantageous for diamond particles, including micron-scale diamond particles and/or nano-scale diamond particles, to be present in the metal nanoparticle paste compositions, thereby leading to formation of a metal-diamond composite following nanoparticle consolidation.

Filling of the vias with metal nanoparticles may take place by any suitable technique. Suitable techniques may include those in which the one or more vias are filled individually with metal nanoparticles, or those in which the one or more vias are filled substantially at the same time. In illustrative embodiments, syringes, syringe arrays, or other arrangements of dispensation devices containing the metal nanoparticle paste compositions may be used for filling the one or more vias. In other illustrative embodiments, printing techniques such as screen printing, stencil printing, or inkjet printing may be used to fill the one or more vias with the metal nanoparticle paste composition. In more specific embodiments, at least a portion of the one or more vias may be filled by screen printing the metal nanoparticle paste composition.

The technique for filling the vias may vary depending upon the size (diameter) of the vias. In illustrative embodiments, smaller vias, such as those about 2 mm or about 3 mm in size or below, can be filled individually using a syringe or similar dispensation device. Automated dispensation into each via may take place in some embodiments, such as with a robotically operated syringe, optionally incorporating a syringe pump. Arrays of syringes or similar arrangements of dispensation devices may be used to fill multiple vias simultaneously or near simultaneously. Larger vias, such as those that are about 2 mm to about 7 mm in size or 3 mm to about 7 mm in size, or even larger, can also be filled individually or simultaneously using a syringe or similar dispensation device, in some embodiments, or more typically, by stencil printing or screen printing techniques using a suitable print head. As such, the vias may be filled one at a time in some embodiments, or multiple vias may be filled with the metal nanoparticle paste compositions at the same time, according to other embodiments. In some embodiments, each of the vias may be filled with the nanoparticle paste composition at the same time.

In some embodiments, vias of sufficiently large size may include a reinforcement material aid in retaining the metal nanoparticle paste composition in place while filling the vias and consolidating the metal nanoparticles. Suitable reinforcement materials may include, for example, aluminum or copper wire mesh, foam, felt or wool. In various embodiments, the mesh, foam, felt or wool may be placed in the vias prior to dispensing the metal nanoparticle paste composition therein. The reinforcement material may interpenetrate within the monolithic metal body within the one or more vias following metal nanoparticle consolidation. Accordingly, in some embodiments, the methods of the present disclosure may comprise placing a reinforcement material in at least a portion of the one or more vias prior to filling the one or more vias with the metal nanoparticle paste composition.

In addition or alternately, in some embodiments, the metal nanoparticle paste composition may have a density that is adjusted to minimize sagging, thereby aiding in retaining the nanoparticle paste composition within the one or more vias. In illustrative embodiments, the metal nanoparticle paste compositions may suitably have a density ranging from about 3.5 g/cm$^3$ to about 6 g/cm$^3$. Higher density values may be more desirable to minimize shrinking and cracking during metal nanoparticle consolidation. Micron-size particles, typically in an amount of about 10 wt. % or more, up to about 35 wt. %, may aid in mitigating shrinkage during metal nanoparticle consolidation.

In some or other embodiments, a removable support may be provided against one side of the vias (e.g., upon the face of the PCB opposite the face where the metal nanoparticle paste composition is loaded into the one or more vias) to preclude sagging and leakage of the nanoparticle paste compositions from the vias prior to metal nanoparticle consolidation. In other embodiments, the removable support may be placed after filling of the vias but before significant sagging has taken place. In some embodiments, the removable support may be an aluminum foil or plate. KAPTON tape, graphoil or similarly performing materials may be used to provide sufficient support in some instances, as well as compressed, monolithic graphite plates or similar materials. The removable support may be removed from the face of the PCB following consolidation of the metal nanoparticles, or the removable support may degrade, disintegrate, or otherwise undergo removal during the course of consolidating the metal nanoparticles (e.g., wax or thermally degradable polymers). In more specific embodiments, the removable support may be used when vias having a diameter of about 5 mm or greater are being filled with a nanoparticle paste composition.

In some embodiments, a deadweight can be applied to the one or more vias after filling, optionally in combination with a removable support opposite the deadweight. The deadweight may aid in increasing compaction of metal nanoparticle paste composition prior to metal nanoparticle consolidation, thereby densifying the monolithic metal body formed in the vias. In some embodiments, the deadweight may be applied to the PCB from the face from which the vias are filled with the metal nanoparticle paste composition.

In various embodiments, consolidating the metal nanoparticles may comprise heating the metal nanoparticles above the fusion temperature, applying pressure to the metal nanoparticles, or any combination thereof. Any heat source may be used to heat the metal nanoparticles above the fusion temperature, such as an oven, autoclave, heating tape, radiant heat source, laser, or the like. In some embodiments, direct laser sintering of the metal nanoparticles within the vias may take place. Other techniques for consolidating the metal nanoparticles within the vias may include, for example, applying pressure with a heated piston from one or both faces of the PCB to affect heating and compaction simultaneously.

In some embodiments, the monolithic metal body within the vias may be metallurgically bonded to a heat sink or similar thermal dissipation device. Direct metallurgical bonding to a heat sink may take place by placing the heat sink in contact with the metal nanoparticle paste composition within the vias before metal nanoparticle consolidation takes place. As such, when the metal nanoparticles undergo consolidation and bond with each other to form a monolithic metal body, the metal nanoparticles at the terminus of the via may similarly form a metallurgical bond to a heat sink in contact with the via as bulk metal is formed.

In some embodiments, the monolithic metal bodies within the vias may be bonded directly to the underside of a heat generating component using thermal grease, a fused nanoparticle layer, solder, thermal underfill, or other methods common in the electronics industry for forming a thermal interface. Thus, such thermal connections may further facilitate heat dissipation through the bottom face of the PCB.

Alternately, the monolithic metal bodies may be directly metallurgically bonded to the underside of a heat generating component.

Optionally, the walls of the vias may be plated with a metal prior to filling the vias with the metal nanoparticle composition. The metal plating on the walls of the vias may promote adhesion of the PCB to the monolithic metal body following metal nanoparticle consolidation. Electrodeposition techniques, such as electroless plating, for example, may be used in particular embodiments to affect metal plating upon the walls of the vias. The metal plating the walls of the vias may be the same as or different than a metal comprising the monolithic metal bodies.

The printed circuit boards and methods of the present disclosure will now be described with further reference to the drawings. FIG. 3A-3D show cross-sectional side views depicting various operations associated with filling a plurality of vias in a printed circuit board with a metal nanoparticle paste composition and subsequently consolidating the metal nanoparticles. As shown, printed circuit board 100 includes substrate 101, upon which conductive traces associated with a printed circuit and other components are defined (not visible in the cross-sectional side views of FIGS. 3A-3D). Vias 102 extend between at least top face 104 and bottom face 106 of substrate 101. Depending on particular application needs, vias 102 may or may not be in electrical communication with the conductive traces or other components defining the printed circuit. As such, vias 102 may be functional, non-functional, or any combination thereof with respect to operation of printed circuit board 100. Thus, vias 102 may or may not exhibit further functionality in addition to performing their role in thermal management, as discussed further herein.

Figure 3A:
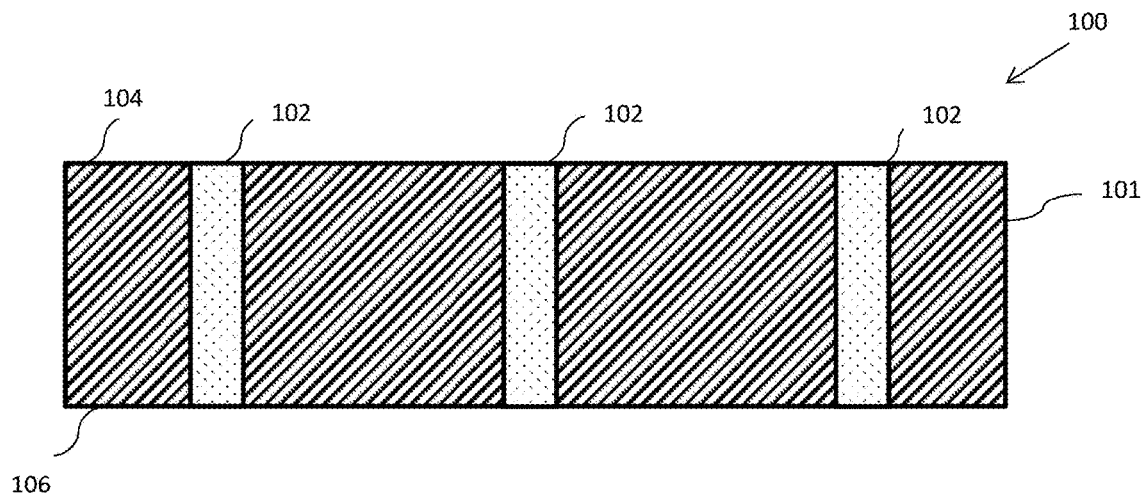
FIGS. 3A-3D show side-view cross-sectional diagrams illustrating various operations associated with filling vias with a metal nanoparticle paste composition and forming a monolithic metal body therein.
Figure 3B:
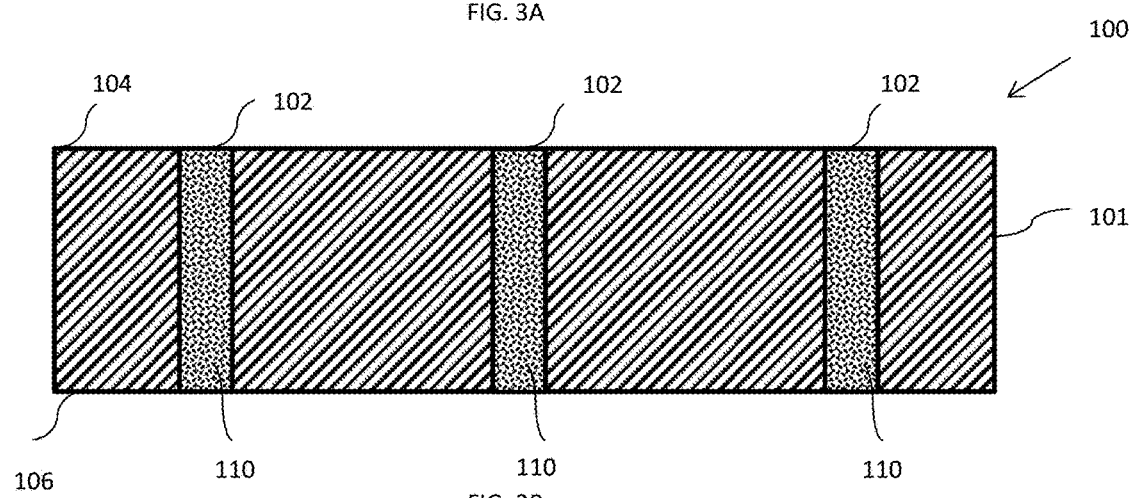
Figure 3C:
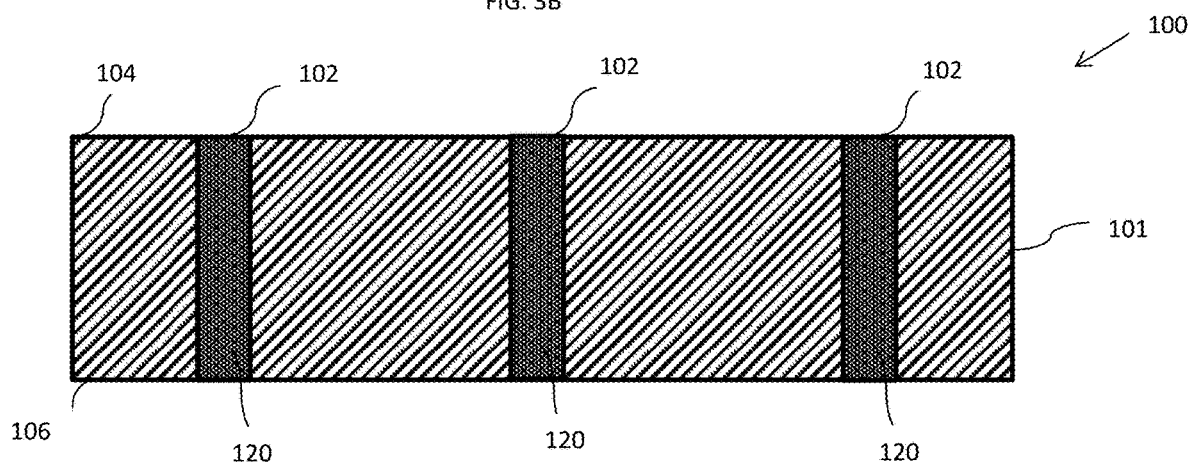

In FIG. 3B, vias 102 have been filled with metal nanoparticle paste composition 110. Optionally, a removable support and/or a deadweight (neither shown) may be utilized during or after filling to promote retention of and/or densification of metal nanoparticle paste composition 110 within vias 102. In FIG. 3C, the metal nanoparticles within metal nanoparticle paste composition 110 have undergone consolidation to form monolithic metal body 120 that fills each of vias 102. Each monolithic metal body 120 extends between at least top face 104 and bottom face 106 with minimal void formation therein.

Figure 3D:
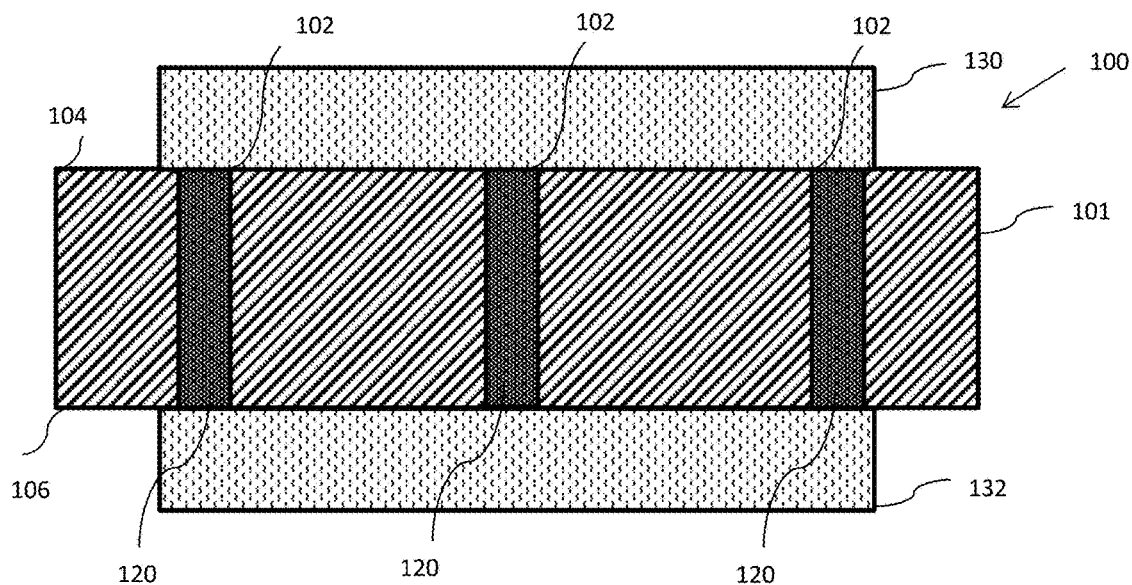

FIG. 3D shows a diagram of heat sink 130 placed in thermal contact with top face 104 and heat sink 132 placed in thermal contact with bottom face 106. Heat transfer to heat sinks 130 and/or 132 may be facilitated with monolithic metal body 120 within each of vias 102. As mentioned above, both of heat sinks 130 and 132 may be present, in some embodiments, and in other embodiments, only one of heat sinks 130 and 132 may be present. Moreover, in some embodiments, one of heat sinks 130 and/or 132 may be adjacent to top face 104 or bottom face 106 (e.g., when directly contacting a heat-producing component of PCB 100) and the other of heat sinks 130 and 132 may directly contact vias 102 upon the opposite face. During direct contact, there is no additional thermal interface layer intervening between monolithic metal body 120 and heat sink 132. Monolithic metal body 120 and heat sink 132 may comprise the same metal in specific embodiments, such as both comprising copper. When multiple heat sinks are present, the heat sinks may function by the same or different mechanisms. In more specific embodiments, the multiple heat sinks may be both passive, both active, or a combination of active and passive. In some embodiments, heat sink 132, for example, may comprise a portion of the mounting, strap, bracket, or case to which PCB 100 is affixed.

In some embodiments, a bonding layer (not shown) may be disposed upon top face 104, which may allow monolithic metal bodies 120 to establish a bond to the underside of a high-power electronic component (not shown). As such, the bonding layer allows thermal conduction to take place through monolithic metal bodies 120 through bottom face 106. That is, the bonding layer may promote heat transfer from the high-power electronic component to the opposite face of PCB 100. When a heat sink also directly contacts the high-power electronic component, dissipation of excess heat may take place from both faces of PCB 100. Alternately, monolithic metal bodies 120 may form a direct metallurgical bond to the high-power electronic component.

Figure 4:
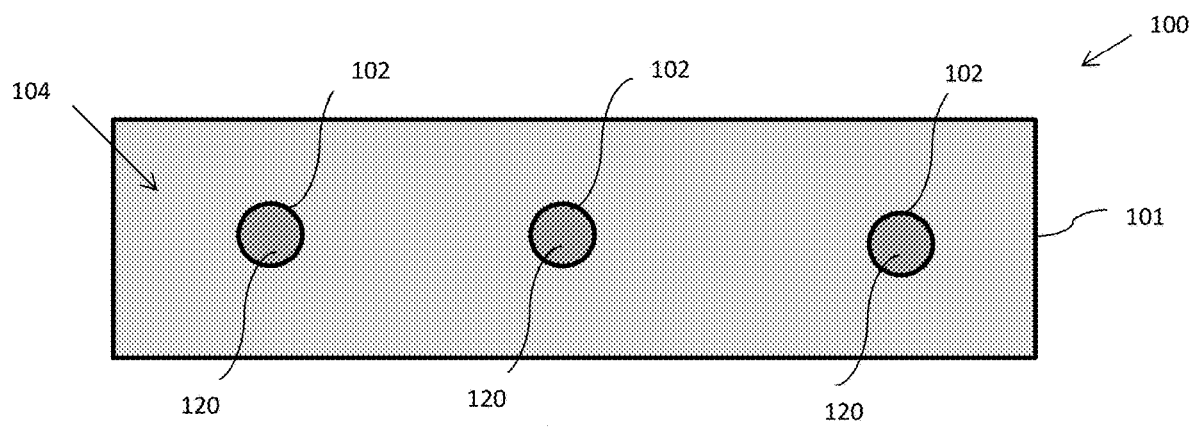
FIG. 4 shows a top-view diagram of a printed circuit board having metal-filled vias extending therethrough.

FIG. 4 shows a corresponding top view of printed circuit board 100, which shows an illustrative positioning of vias 102 and monolithic metal bodies 120. The location of vias 102 may vary depending upon the location of other components within or coupled to printed circuit board 100, and the positioning of vias 102 should not be considered limiting. Moreover, the number of vias 102 should not be considered limiting, such that the number of vias 102 may be selected to promote a desired extent to thermal transfer. In the interest of clarity, additional electronic circuitry and components of printed circuit board 100 are not shown in FIG. 4.

Embodiments disclosed herein include:

A. Thermal management methods employing one or more vias. The methods comprise: providing a printed circuit board (PCB) defined upon a substrate and having one or more vias extending through the substrate between a first face and a second face; filling the one or more vias with a metal nanoparticle paste composition that is adapted to limit shrinkage during metal nanoparticle consolidation; consolidating metal nanoparticles of the metal nanoparticle paste composition within the one or more vias to form a monolithic metal body filling each of the one or more vias; and placing a heat sink upon at least one of the first face or the second face, the heat sink contacting each monolithic metal body.

B. Printed circuit boards comprising one or more thermal vias. The printed circuit boards comprise: a substrate having one or more vias extending therethrough between a first face and a second face; a monolithic metal body formed from metal nanoparticles filling each of the one or more vias, the monolithic metal body having a uniform nanoporosity ranging from about 2% to about 30%; and a heat sink upon at least one of the first face or the second face, the heat sink contacting each monolithic metal body.

C. Printed circuit boards comprising one or more thermal vias in excess of 1 mm in size. The printed circuit boards comprise: a substrate having one or more vias extending therethrough between a first face and a second face, at least a portion of the one of more vias being about 1 mm or larger in diameter; a monolithic metal body formed from metal nanoparticles filling each of the one or more vias; wherein at least a portion of the one or more vias contain a reinforcement material that extends through at least a portion of the monolithic metal body; and a heat sink upon at least one of the first face or the second face, the heat sink contacting each monolithic metal body.

Each of embodiments A, B, and C may have one or more of the following additional elements in any combination:

Element 1: wherein the metal nanoparticles comprise copper nanoparticles.

Element 2: wherein the metal nanoparticle paste composition further comprises at least one additive selected from the group consisting of diamond particles, micron-scale metal particles, and any combination thereof.

Element 3: wherein the monolithic metal body further comprises a plurality of diamond particles.

Element 4: wherein a first heat sink is located upon or adjacent to the first face of the PCB and a second heat sink is located upon or adjacent to the second face of the PCB.

Element 5: wherein the first heat sink and the second heat sink dissipate heat by different mechanisms.

Element 6: wherein at least a portion of the one or more vias are filled using a syringe that contains the metal nanoparticle paste composition.

Element 7: wherein at least a portion of the one or more vias are filled by screen printing the metal nanoparticle paste composition.

Element 8: wherein the method further comprises: placing a reinforcement material in at least a portion of the one or more vias prior to filling the one or more vias with the metal nanoparticle paste composition.

Element 9: wherein the heat sink is placed in contact with the metal nanoparticle paste composition before consolidating the metal nanoparticles, and becomes metallurgically bonded to the monolithic metal body as the metal nanoparticles undergo consolidation.

Element 10: wherein the monolithic metal body comprises copper and is formed from copper nanoparticles.

Element 11: wherein at least a portion of the one or more vias contain a reinforcement material.

Element 12: wherein the heat sink is metallurgically bonded to the monolithic metal body.

Element 13: wherein the one or more vias are about 1 mm or larger in diameter.

Element 14: wherein at least a portion of the one or more vias are not in electrical communication with additional components located upon the PCB.

Element 15: wherein the nanoparticle paste composition has a density ranging from about 3.5 g/cm$^3$ to about 6 g/cm$^3$.

By way of non-limiting example, exemplary combinations applicable to A, B, C include: 1 and 2; 1 and 3; 1 and 4; 1, 4 and 5; 1 and 6; 1 and 7; 1 and 8; 1 and 9; 1 and 10; 1, 10 and 11; 1 and 12; 1 and 13; 1 and 14; 1 and 15; 2 and 4; 2, 4 and 5; 2 and 6; 2 and 7; 2 and 9; 2 and 10; 2 and 11; 2 and 12; 2 and 13; 2 and 14; 2 and 15; 3 and 4; 3, 4 and 5; 3 and 6; 3 and 7; 3 and 8; 3 and 9; 3 and 10; 3 and 11; 3, 10 and 11; 3 and 12; 3 and 13; 3 and 14; 3 and 15; 6 or 7 and 8; 6 or 7 and 9; 6 or 7 and 10; 6 or 7 and 11; 6 or 7 and 12; 6 or 7 and 13; 6 or 7 and 14; 6 or 7 and 15; 10 and 11; 10 and 12; 10 and 13; 10 and 14; 10 and 15; 11 and 12; 11 and 13; 11 and 14; 11 and 15; and 13 and 15.

Unless otherwise indicated, all numbers expressing quantities of ingredients, properties such as molecular weight, reaction conditions, and so forth used in the present specification and associated claims are to be understood as being modified in all instances by the term "about." Accordingly, unless indicated to the contrary, the numerical parameters set forth in the following specification and attached claims are approximations that may vary depending upon the desired properties sought to be obtained by the embodiments of the present invention. At the very least, and not as an attempt to limit the application of the doctrine of equivalents to the scope of the claim, each numerical parameter should at least be construed in light of the number of reported significant digits and by applying ordinary rounding techniques.

One or more illustrative embodiments incorporating the features of the present disclosure are presented herein. Not all features of a physical implementation are described or shown in this application for the sake of clarity. It is understood that in the development of a physical embodiment incorporating the present disclosure, numerous implementation-specific decisions must be made to achieve the developer's goals, such as compliance with system-related, business-related, government-related and other constraints, which vary by implementation and from time to time. While a developer's efforts might be time-consuming, such efforts would be, nevertheless, a routine undertaking for those of ordinary skill in the art and having benefit of this disclosure.

Therefore, the present disclosure is well adapted to attain the ends and advantages mentioned as well as those that are inherent therein. The particular embodiments disclosed above are illustrative only, as the present disclosure may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered, combined, or modified and all such variations are considered within the scope and spirit of the present invention. The disclosure herein suitably may be practiced in the absence of any element that is not specifically disclosed herein and/or any optional element disclosed herein. While compositions and methods are described in terms of "comprising," "containing," or "including" various components or steps, the compositions and methods can also "consist essentially of" or "consist of" the various components and steps. All numbers and ranges disclosed above may vary by some amount. Whenever a numerical range with a lower limit and an upper limit is disclosed, any number and any included range falling within the range is specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values. Also, the terms in the claims have their plain, ordinary meaning unless otherwise explicitly and clearly defined by the patentee. Moreover, the indefinite articles "a" or "an," as used in the claims, are defined herein to mean one or more than one of the element that it introduces.

The invention claimed is:

1. A method comprising:
providing a printed circuit board (PCB) defined upon a substrate and having one or more vias extending through the substrate between a first face and a second face;
filling the one or more vias with a metal nanoparticle paste composition, the metal nanoparticle paste composition being adapted to limit shrinkage during metal nanoparticle consolidation and comprising one or more organic solvents, metal nanoparticles coated with one or more surfactants, and about 10 wt. % to about 35 wt. % micron-size particles;
wherein at least a portion of the one or more organic solvents have a boiling point higher than that of the one or more surfactants; and
wherein the metal nanoparticle paste composition has a density ranging from about 3.5 g/cm$^3$ to about 6 g/cm$^3$;
consolidating the metal nanoparticles of the metal nanoparticle paste composition within the one or more vias to form a monolithic metal body filling each of the one or more vias; and placing a heat sink upon at least one of the first face or the second face, the heat sink contacting each monolithic metal body.

2. The method of claim 1, wherein the metal nanoparticles comprise copper nanoparticles.

3. The method of claim 2, wherein the metal nanoparticle paste composition further comprises diamond particles.

4. The method of claim 3, wherein the metal nanoparticle paste composition further comprises carbon fibers.

5. The method of claim 1, wherein the micron-scale particles comprise micron-scale metal particles.

6. The method of claim 1, wherein the monolithic metal body further comprises a plurality of diamond particles.

7. The method of claim 1, wherein a first heat sink is located upon the first face of the PCB and a second heat sink is located upon the second face of the PCB.

8. The method of claim 7, wherein the first heat sink and the second heat sink dissipate heat by different mechanisms.

9. The method of claim 1, wherein at least a portion of the one or more vias are filled using a syringe that contains the metal nanoparticle paste composition.

10. The method of claim 1, wherein at least a portion of the one or more vias are filled by screen printing the metal nanoparticle paste composition.

11. The method of claim 1, further comprising:
placing a reinforcement material in at least a portion of the one or more vias prior to filling the one or more vias with the metal nanoparticle paste composition, the reinforcement material extending through at least a portion of the monolithic metal body after consolidation of the metal nanoparticles.

12. The method of claim 1, wherein the heat sink is placed in contact with the metal nanoparticle paste composition before consolidating the metal nanoparticles, and becomes metallurgically bonded to the monolithic metal body as the metal nanoparticles undergo consolidation.

13. The method of claim 1, wherein the monolithic metal body has a uniform nanoporosity ranging from about 2% to about 30%.

14. The method of claim 1, wherein the one or more vias are about 1 mm or larger in diameter.

15. The method of claim 14, further comprising:
placing a reinforcement material in at least a portion of the one or more vias prior to filling the one or more vias with the metal nanoparticle paste composition, the reinforcement material extending through at least a portion of the monolithic metal body after consolidation of the metal nanoparticles.

16. The method of claim 1, wherein the metal nanoparticle paste composition further comprises diamond particles and a carbide forming additive effective to form a carbide layer upon the diamond particles.

17. The method of claim 1, wherein the metal nanoparticle paste composition further comprises carbon fibers.

* * * * *